United States Patent [19]

Feuerbaum et al.

[11] Patent Number: 4,713,543
[45] Date of Patent: Dec. 15, 1987

[54] SCANNING PARTICLE MICROSCOPE

[75] Inventors: Hans-Peter Feuerbaum, Munich; Juergen Frosien, Ottobrunn; Rainer Spehr, Ober-Ramstadt, all of Fed. Rep. of Germany

[73] Assignee: Siemens Aktiengesellschaft, Berlin and Munich, Fed. Rep. of Germany

[21] Appl. No.: 751,020

[22] Filed: Jul. 2, 1985

[30] Foreign Application Priority Data

Aug. 13, 1984 [DE] Fed. Rep. of Germany ....... 3429804

[51] Int. Cl.$^4$ .............................................. H01J 37/04
[52] U.S. Cl. .................................... 250/310; 250/309; 250/311; 250/398
[58] Field of Search .................. 250/310, 398, 492.2, 250/309, 311

[56] References Cited

U.S. PATENT DOCUMENTS

| | | | |
|---|---|---|---|
| 3,760,180 | 9/1973 | Weber | 250/310 |
| 3,792,263 | 2/1974 | Hashimoto et al. | 250/310 |
| 4,075,488 | 2/1978 | Okayama et al. | 250/396 R |
| 4,277,679 | 7/1981 | Feuerbaum | 324/158 D |
| 4,330,707 | 5/1982 | Manzke | 250/310 |
| 4,439,685 | 3/1984 | Plies | 250/398 |

FOREIGN PATENT DOCUMENTS 3138926 4/1983 Fed. Rep. of Germany .
3204897 8/1983 Fed. Rep. of Germany .

OTHER PUBLICATIONS

"On the Theory of the Boersch Effect", Rose et al, Optik 57 (1980), No. 3, pp. 339-364.
"Energy Broadening in High-Density Electron and Ion Beams; The Boersch Effect", Rose et al, Advances in Electronics and Electron Physics, Supplement 13C, 1983.

Primary Examiner—Craig E. Church
Assistant Examiner—Jack I. Berman
Attorney, Agent, or Firm—Hill, Van Santen, Steadman & Simpson

[57] ABSTRACT

There is disclosed a scanning particle microscope in which the adverse influence of the Boersch effect is reduced. This is achieved by providing an elastrostatic retardation element in the particle optics unit to decelerate the particle from a first energy, at which the particles are generated, to a second energy which is less than half of the first energy.

23 Claims, 6 Drawing Figures

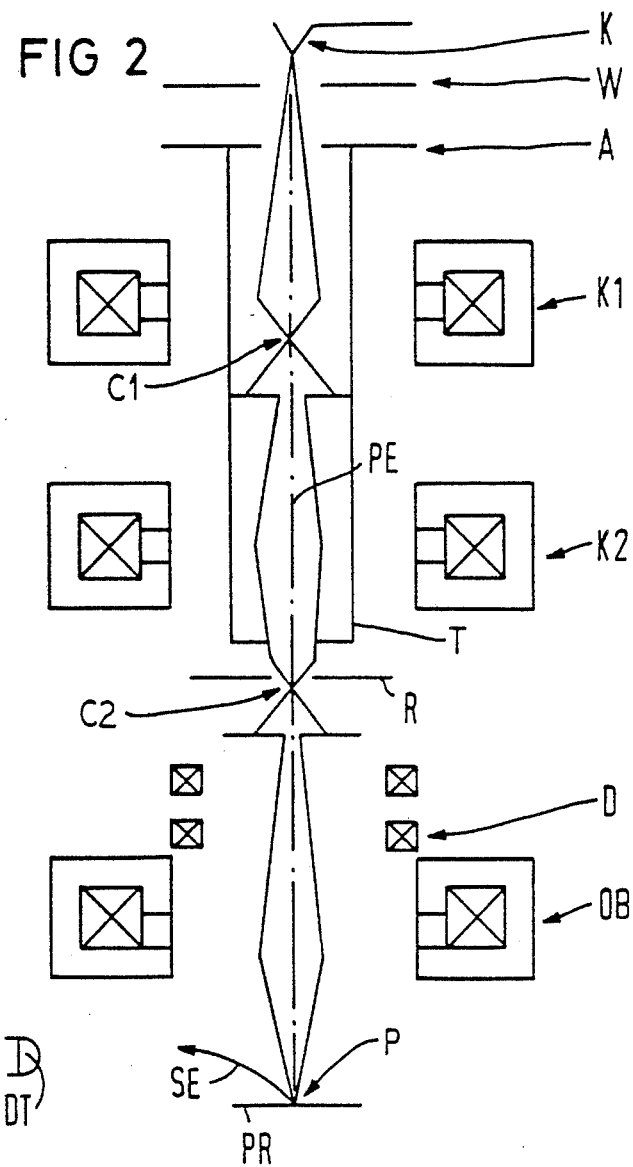

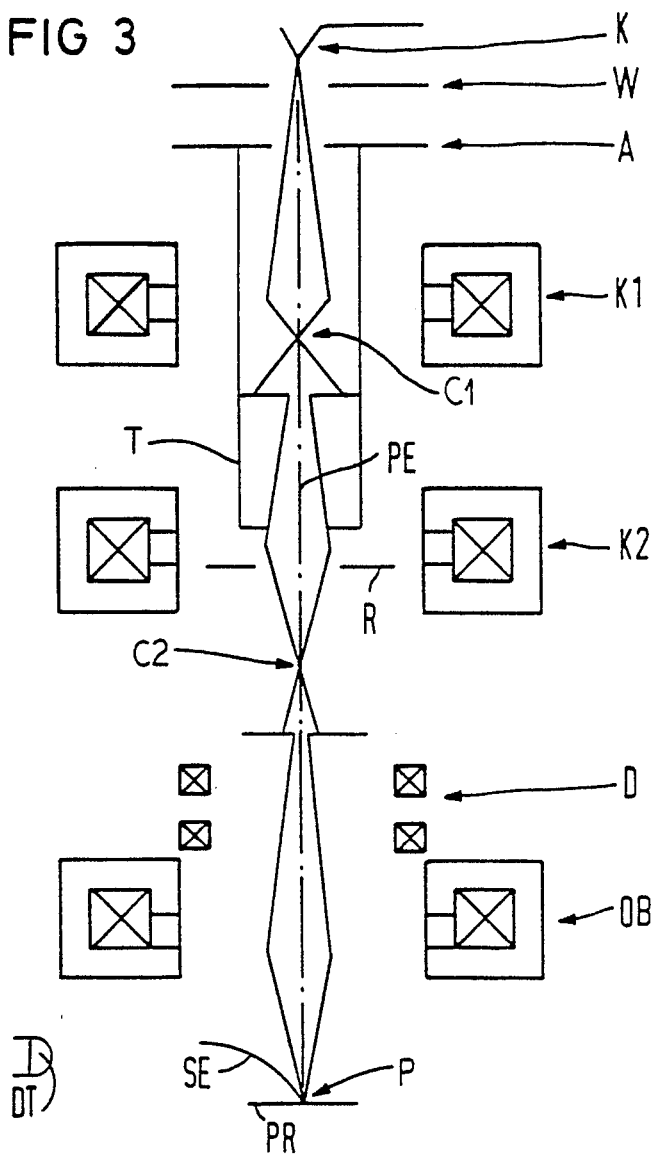

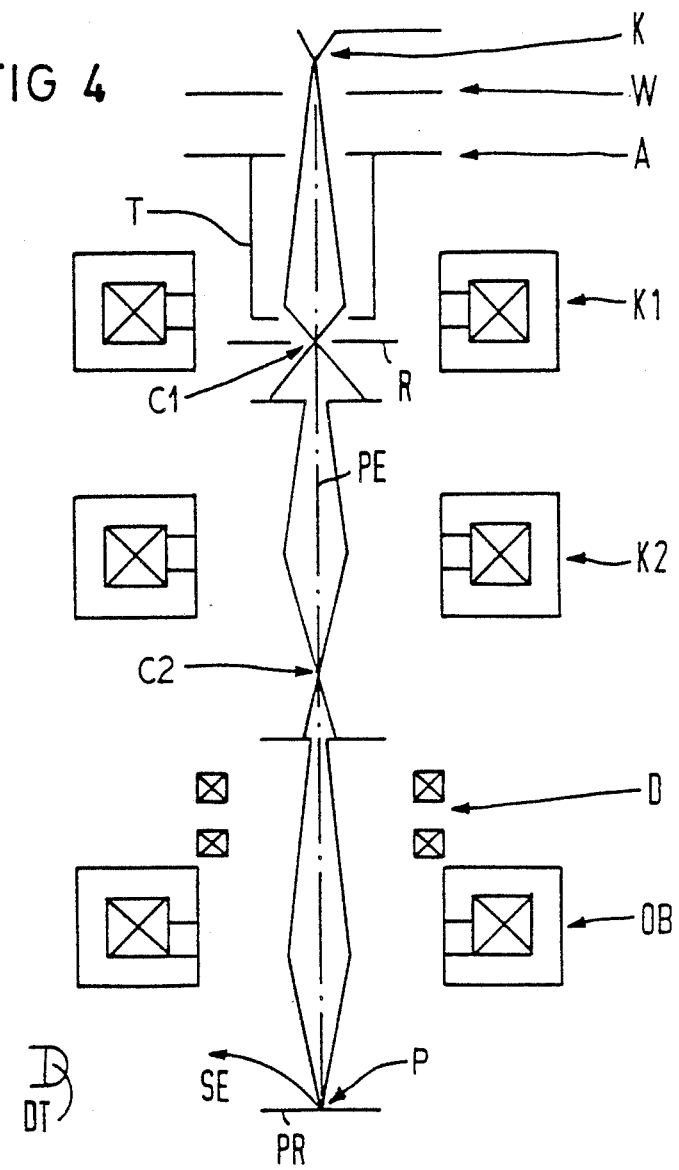

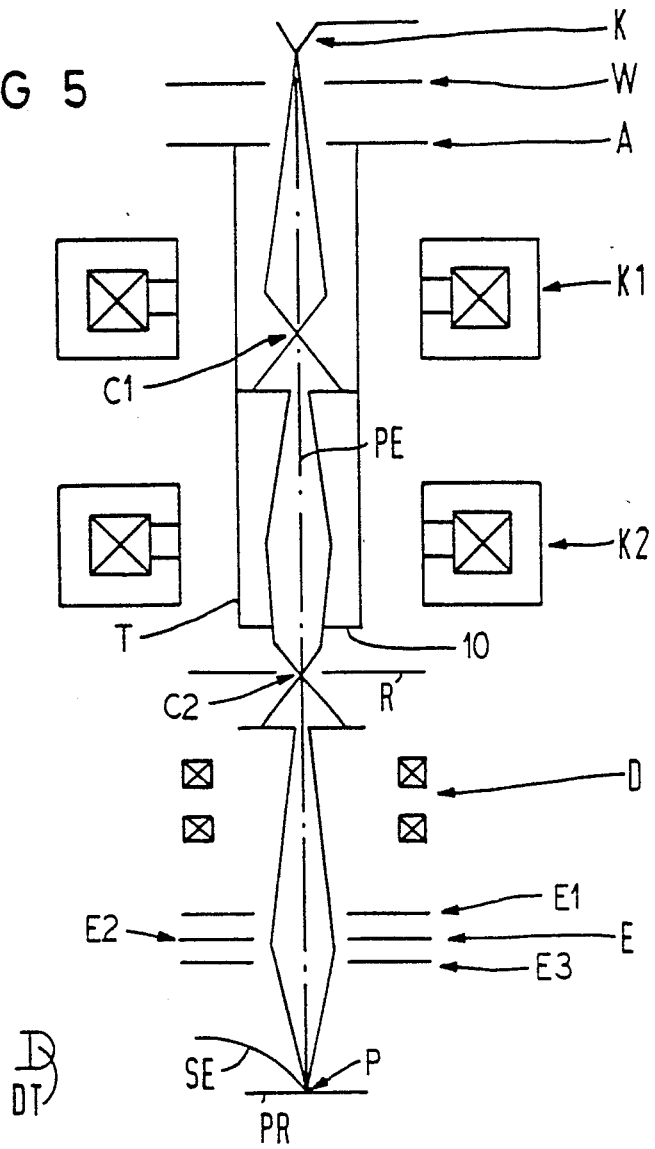

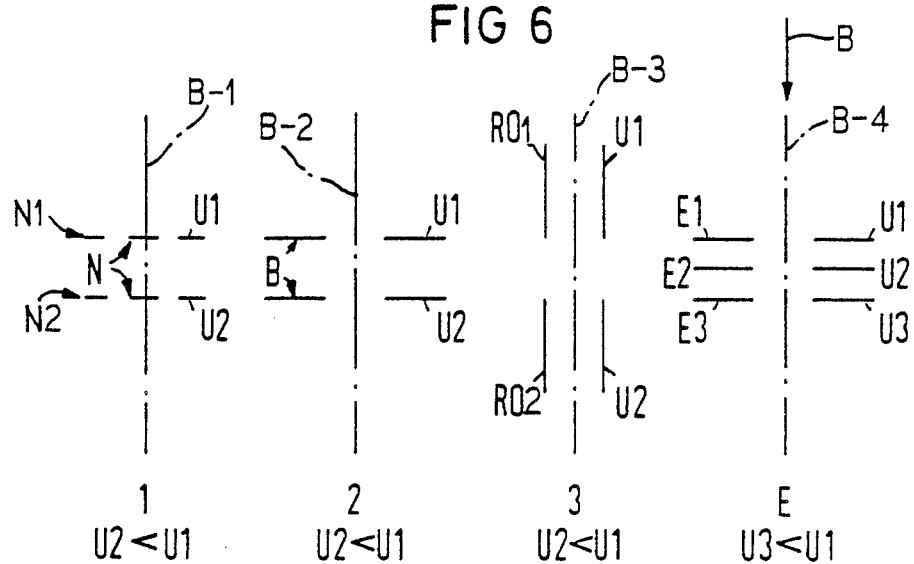

SCANNING PARTICLE MICROSCOPE

BACKGROUND OF THE INVENTION

The invention relates to a scanning particle microscope comprising a particle beam generator and comprising at least one additional lens in the particle beam path.

Scanning electron microscopes are being employed to an increasing degree in the semiconductor industry in the manufacture of integrated circuit components for the inspection of micro-electronic components or of articles that are required in the manufacture of micro-electronic components, for example for the inspection of masks and wafers. The employment of a scanning electron microscope in the measurement of electric potentials is known, for example, from U.S. Pat. No. 4,277,679. The employment of a scanning electron microscope for generating microstructures by means of electron beam lithography is known, for example, from U.S. Pat. No. 4,075,488. Over and above this, a scanning electron microscope can also be employed for monitoring the individual process steps in the manufacture of an integrated electronic component, for example in order to check length dimensions, or the positioning of a mask or wafer.

In mensurational applications of a scanning electron microscope such as, for example, in the measurement of spatial dimensions or in the measurement of electric potentials, care must be taken that the test results are not falsified due to charging of the surface of the object under test. In order to avoid a charging of a surface of an object under test, the surface of the object can be rendered conductive by vapor deposition with conductive material. In measurement applications wherein a vapor deposition of the surface with conductive material is not possible due to required further processing of the object to be investigated, as is usually the case, for example, for objects under test in micro-electronics, it is generally necessary that the primary electrons impinge on the surface of the object with such energies that, on chronological average, the charge leaving the surface of the object (e.g. as secondary electron emission) is exactly equal to the charge applied to the surface. The energies of the incident primary electrons at which a charge balance is achieved between charge impinging on the surface and charge departing from the surface are generallly relatively low and typically lie in the range from about 500 eV to two keV. For the case of special operating modes wherein the incident charge has to be compensated for only as an average result over the course of time, or where the object under test is composed of special materials, an adequate charge balance or avoidance of charging of the surface of an object under test can still be achieved even for impinging energies of the primary electrons up to ten keV and above.

In electron beam printers, the energies of the primary particles impinging on the surface of an object are presently on the order of about twenty keV. However, the tendency can be observed that lower energies of the primary particles are likely to be desired in the future in electron beam printers. Such lower energies are desirable since the lower the energy of the primary particles incident on an object, the lower is the proximity effect, and the lower is the scatter volume in the resist and in the target. Consequently in the future there will be a need not only for printers having finer and finer particle beam probes with higher and higher particle beam current, but also for progressively lower energies of the impinging particles. For a conventional scanning electron microscope, these desirable objectives are contradictory, since the lower the energy of the particles in the particle beam, the lower is the resolution of measurements utilizing such conventional scanning electron microscopes, the larger is the diameter of the particle probe incident on the target, and the lower is the particle beam current. Conventional scanning electron microcopes are therefore not optimally adapted for anticipated high production high resolution printing and measurement applications. In conventional scanning electron microscopes the cause of the difficulties is the so-called Boersch effect (H. Rose, R. Spehr, Advances in Electronics and Electron Physics, Supplement 13c. 1983, pages 475-530) which opposes focussing of the particles in the particle beam. The brightness of, specifically, high-intensity particle sources (such as, for example, lanthanum hexaboride single crystal cathodes for generating electron beams) can therefore not be fully exploited. Particularly given low energies of the particles, the brightness decreases due to the Boersch effect along the beam path from the particle source to the target on which the particles impinge. Given an electron beam having an energy of the electrons of one keV, the loss in brightness along the path from the electron source to the target can exceed a factor of twenty. For the case where the particles are of low energy, the crossover points of the particle beam that lie beyond the various lenses along the beam path are considerably broadened (increased in area) under certain conditions, this leading to a broadened (increased area) of the particle probe, to a deterioration of a mensurational resolution and to a reduction of the particle current density.

German OS 31 38 926 discloses an electron microscope for generating high-current probes comprising a single-stage probe shaping system utilizing a short focal length imaging lens. Since H. Rose et al have shown in "Optik" 57, 1980, No. 3, pages 339-364, that the energy spread of the primary electron beam rises proportionally with the number of electron beam crossover points, the Boersch effect is diminished in the electron microscope of this German OS No. 31 38 926. Such a known electron microscope, however, is not suitable for applications in which a large working interval is required between the lens system and the target, or in which a blanking system is required that is disposed at a beam crossover point that is relatively easily accessible and that must have a relatively large interval from the target so that detrimental effects of the potentials present in the blanking system on the target are avoided.

German OS No. 32 04 897 discloses a particle beam generating system that is designed as a tetrode. According to this disclosure, a sub-system of the particle beam generating system, composed of cathode, Wehnelt electrode and anode, is operated such that for a specific particle beam energy, optimum field intensities and, thus, an optimum brightness are achieved. In order to obtain different particle beam energies, the difference in potential between this sub-system and the additional, following electrode can be set to different values. In this way, a particle beam having an optimum brightness and a desired particle beam energy is generated in the particle beam generating system. With this known particle beam generator, however, the optimum brightness existing immediately following the particle beam generator cannot be prevented from being reduced over the further particle beam path due to the Boersch effect.

SUMMARY OF THE INVENTION

The object of the present invention is to provide a scanning particle microscope of the type initially cited wherein the adverse influence of the Boersch effect is reduced in comparison to a scanning particle microscope according to the prior art.

This object is inventively achieved by a scanning particle microscope wherein a retardation means for decelerating the particle beam is disposed at a distal portion of the particle beam path such that deceleration is applied to the beam at the earliest only after the beam has exited from the particle beam generating system and entered a following lens with a relatively high energy. Preferably, the particle beam maintains its high energy as it traverses the lens following the beam generating system, and is decelerated at the earliest at the crossover produced by such lens. For a multistage lens system following the beam generator, it is preferred to apply the decelerating field after the beam has traversed several of the lenses of such lens system, for example the retardation means being placed at the last crossover before the target or even closer to the target. Advantageous specific developments and features of the invention are shown in the drawings and are further defined in the following description and claims.

A scanning particle microscope of the invention is suited not only for generating electron beams but also for generating any desired types of ion beams, for example.

A scanning particle microscope according to the present invention enables a fine particle probe with high particle current even while also providing low energies for the particles as they impinge on the target. It had previously been assumed that the Boersch effect plays an important part only in the particle beam generator and in the beam intersection regions (crossovers). New calculations have shown, however, that the Boersch effect plays an important part not only in the particle beam generator and in the beam crossovers but also in the entire beam path. As a consequence of the Boersch effect, the brightness that is established immediately following the beam generator is diminished over the further particle beam path. The longer this particle beam path, the more pronounced the disadvantageous influences of the Boersch effect. Where a lanthanum hexaboride single crystal cathode is employed with an impingement energy of the electrons of one keV on a specimen, the brightness in the unaltered particle beam path of a scanning electron microscope of type S 150 of Cambridge Instruments is reduced by a factor of forty due to the Boersch effect. When, by contrast, the particle beam path of the same scanning electron microscope of type S 150 is modified in the inventive fashion, so that the electrons have an energy of twenty keV up to the center of the objective lens and are not decelerated to the impingement energy of one keV until in the center of such objective lens, the brightness is reduced by only a factor of four with boundary conditions that are otherwise the same. This means a gain in brightness by a factor of ten in comparison to a scanning electron microscope of the prior art. When, in another embodiment, the electrons in the same scanning electron microscope of type S 150 have an energy of ten keV up to the center of the objective lens and when the electrons are not decelerated to the impingement energy of one keV until in the center of the objective lens, then the brightness at the level of the target is reduced by a factor of 5.5 relative to the brightness immediately following the electron source. In this example, this means a gain in brightness at the level of the target by a factor of about seven over the prior art.

When, in a further example using the same scanning electron microscope, the electrons have an energy of five keV after departing the beam generator up to the center of the objective lens and when they are then decelerated in the center of the objective lens to the impingement energy of one keV, then the brightness at the level of the object is poorer by a factor of ten than immediately following the electron source. In this case, this means a gain in brightness at the level of the target by a factor of four over the prior art.

When the electrons in the same scanning electron microscope type S 150 have an energy of 2.5 keV between the electron source and the center of the objective lens and when the electrons are not decelerated to the impingement energy of one keV until in the center of the objective lens, then the brightness is poorer by a factor eighteen at the level of the target than immediately following the electron source. This, however, still means a gain in brightness by a factor of about 2.2 over the prior art.

The closer the deceleration point to the specimen when the parameters are otherwise unaltered, the greater is the gain in brightness. The closer a deceleration point is to the particle source with otherwise unaltered parameters, the lower is the gain that is achieved in brightness.

For a single-stage particle beam path that comprises only one lens producing a single crossover, which is at the target, the deceleration point for the particles is placed in the sole lens or between the sole lens and the target.

For a particle beam path having two lenses which produce respective crossovers prior to the target, a great gain in the brightness is achieved when the deceleration point is disposed in the second crossover which is nearest the target. For a particle beam path comprising n lenses producing n crossovers prior to the target, a deceleration point can be advantageously disposed at the $n^{th}$ crossover or in one of the preceding crossovers. When only the gain in brightness is important, then it is most advantageous for the case of a lens system with n crossovers prior to the target and with a single deceleration point at one of the crossovers, when the deceleration point is disposed in the $n^{th}$ crossover and when, under given conditions, a beam blanking system is additionally provided at the same crossover.

Depending on the manner of use of the microscope it can be favorable to provide a plurality of deceleration devices. This depends on whether additional devices must be accomodated at the particle beam path, how large the working interval between the last lens and the target should be, whether the target is adversely influenced in function or in structure due to high potentials in the proximity of the target, and whether the deceleration devices have lens-like properties at the same time or are integrated in lenses (and, thus, their influence on the entire beam path must also be taken into consideration when they are designed).

When, for example, a large working interval is required, a single lens is generaly inadequate. For the incorporation of a beam blanking system which must be charged with a potential for blanking which differs greatly in comparison to the potential of the specimen, an easily accessible crossover, for example, is required in the particle beam path and this must additionally have a defined minimum distance from the specimen.

In the simplest case, a device for decelerating the particles in the particle beam path is composed of an electrode e.g. in the form of a network maintained at a suitable decelerating potential, or is composed of a plurality of electrodes e.g. in the form of respective networks having a selected spacing along the beam path and maintained at respective potentials to define a deceleration field. To a first approximation, a wire mesh (net-like) electrode or a grid electrode does not have a lens effect when the parallel elements of the respective sets of such elements which define a mesh or the single set of parallel elements which define a grid do not have large spacings from one another. In order to have simple potential distributions in the particle beam path, it is expedient to dispose two wire mesh electrodes immediately following one another, whereby the second wire mesh electrode is employed as retarding electrode. However, a single wire mesh electrode can also be employed insofar as the more complicated distribution of potential is then taken into consideration in the design of the other devices in the particle beam path. This applies not only to wire mesh electrodes but also to all other devices that could be employed for decelerating the particles.

Fundamentally, any electrostatic retardation element can be employed for decelerating the particles. In particular, two-electrode or multiple-electrode arrangements (having more than two electrodes) can be used. As devices for decelerating with lens effects, apertured diaphragms, tube lenses or retarding lenses (Einzel-lens) or combinations thereof or such lens-effect devices together with wire mesh electrodes can be utilized. Electrostatic lenses can be provided in addition to magnetic lenses or instead of magnetic lenses.

An electron-optically favorable combination of an electrostatic retarding system with an objective lens is advantageous. A means for deceleration can be combined with an objective lens in an electrostatic immersion objective lens. A high brightness at the level of the target and a fine probe on the target are thus simultaneously possible.

The invention can also be employed for electron beam printers. For example, the electrons can have an energy of fifty keV up to the deceleration point and can then be retarded to the normal impinging energy, for example twenty keV. A fine probe with very high beam current and yet with relatively low impinging energies is thus achieved. For the printing of finer and finer structures, at higher and higher writing speed and using beam sources supplying an increasingly higher brightness the embodiments of the present invention which achieve a very high current at the target itself (i.e. a very high probe current) shall become increasingly important in the future.

An optimum relationship between electron-optical lens effect and the effects with respect to the brightness at the level of the target must be found. In case an already existing objective lens in a particle beam path is unsuitable, the means for decelerating the particles must be displaced further back along the beam path, i.e. closer to the initial lens.

So that only small lens aberrations need be accepted, the fewest possible additional lens effects should be introduced into the particle beam path. For this purpose, one wire mesh electrode is most expediently employed in one crossover.

The influence of the Boersch effect is all the more detrimental the more slowly the particles move in the particle beam path.

In order to obtain a reduction in chromatic aberrations in the particle beam path, the energy spread of the particles before the deceleration point should be slight. Voltages that are all too high should therefore not be employed before the deceleration point. For the case of electrons, accelerating voltages before the deceleration point between about five keV and fifteen keV are generally desirable from the standpoint of reduced chromatic aberration. This, however, depends on the electron-optical lenses employed and on the conditions of application. The probe size plays a role here similar to the search for an optimum aperture for a specific probe size, i.e. there is an optimum accelerating voltage preceding the deceleration point for a specific probe size. This optimum accelerating voltage can be readily experimentally determined by a person skilled in the art based on the teachings of the present disclosure.

In case the deceleration point must be disposed relatively far from the target for electrostatic reasons, the demagnification of the objective lens should, insofar as possible, not be too great so that the length of the particle beam path can be kept short overall. The shorter the beam path, namely, the less pronounced are the disadvantageous influences due to the Boersch effect. The low-voltage section of a scanning electron microscope should therefore be as short as possible following the deceleration point. The demagnification in this low-voltage section should therefore be as slight as possible. When, for example, the demagnification in this low-voltage region is only 3-fold instead of 6-fold, then a brightness gain by a factor of 1.5 is achieved.

Illustrative embodiments of the invention are shown on the accompanying drawing sheets and shall be described in greater detail below; and other objects features and advantages of this invention will be readily apparent from the following detailed description and from the appended claims.

BRIEF DESCRIPTION OF THE DRAWINGS

FIGS. 1-5 show low-voltage scanning microscopes with electron deceleration; and

FIG. 6 shows various retardation devices for decelerating the primary electron beam.

DETAILED DESCRIPTION

Figure 1:
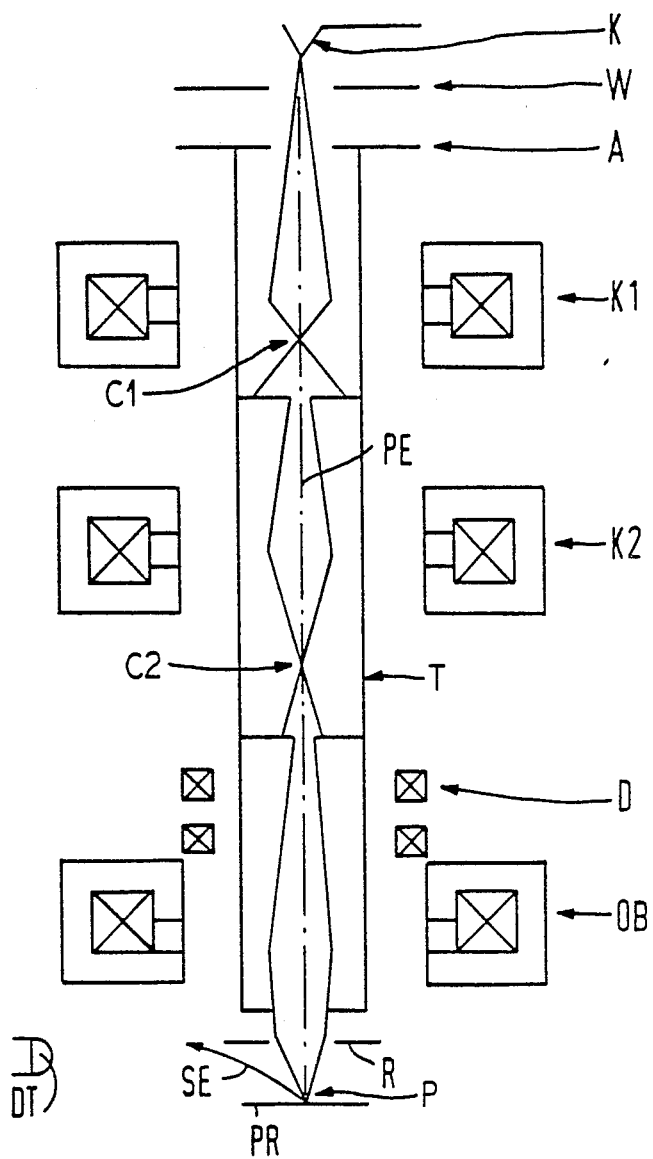

In a low-voltage scanning microscope according to FIGS. 1-5, the electrons PE are predominantly conducted at relatively high potential. For mensurational purposes, the electrons PE should, for example, impinge on the surface of the specimen or target PR with an energy of one keV. In this case, the electrons PE preceding the deceleration electrode R have, for example, an energy about two keV, advantageously above four keV, and particularly above ten keV or twenty keV. The electrons PE are thus not decelerated to the desired, low impingement energy until relatively close to the specimen PR. Thereby achieved is that the influences of the Boersch effect are greatly reduced. Relatively high energies of the primary electrons should be employed particularly in the region of the lower condenser lens K2 and in the region of the upper condenser lens K1 where high electron current densities still exist, because a significant part of the deterioration of the brightness occurs in these regions.

In FIGS. 1-5, the cathode K lies at a potential relative to ground of −1 kV (minus one kilovolt), the Wehnelt electrode W lies at a potential of about −1.5 kV and the anode lies at a potential of +19 kV.

The primary electrons PE are accelerated to a relatively high energy level in a proximal portion of the beam path before reaching the lens system. Shortly before reaching the specimen PR or after traversing at least one condenser lens, the primary electrons are decelerated to the desired, low impinging energy. At least a part of the beam path as well as the critical beam crossover points (foci) e.g. as indicated at C1 and C2, FIG. 1, are thereby traversed with high energy. The resolution-vitiating influence of the Boersch effect is substantially reduced in this way.

In the illustrative embodiment of FIG. 1, the primary electrons PE have a high primary electron energy in nearly the entire beam path and are not decelerated until reaching a distal portion of the beam path in or after the objective lens OB. The retarding electrode preferably lies at a potential of zero volts (0 V). Secondary electrons SE that are produced at the point of incidence of the primary electrons PE on the target PR can be collected at a detector DT for mensurational purposes. The deflector coils D serve as deflection devices for scanning the probe P of the primary electrons PE, in the target region. The charge balance is such that substantial charging of the surface of target PR is avoided.

In the low-voltage scanning microscope according to FIG. 2, the primary electrons PE are decelerated in a distal portion of the beam path between the lower condenser lens K2 and the objective lens OB. When a scanning electron microscope comprises only a single condenser lens, then, in an analogous embodiment, the retarding electrode R is disposed between this sole condenser lens and the objective lens of the scanning electron microscope.

In the low-voltage scanning microscope of FIG. 3, the primary electrons PE are decelerated in the condenser lens K2. In this case, the retarding electrode R is disposed in the condenser lens K2.

The embodiments of FIG. 2 and FIG. 3 have the advantage that a source image (crossover C2) that lies at ground potential (0 V) is accessible. The retarding electrode R in the illustrative embodiments of FIGS. 1 through 4 has a respective potential of zero volts (0 V). In order to better define the potential of the electrons PE, the electrons PE move in a tube T of non-ferromagnetic electrically conductive material until directly preceding the retarding electrode R, this tube having the potential of the anode A. This tube is longest in FIG. 1, shorter in FIG. 2, even shorter in FIG. 3 and shortest in FIG. 4.

A beam blanking system can be advantageously disposed where the source image at grounded potential is accessible.

In the illustrative embodiments of FIGS. 2-4, imaging errors that arise when decelerating the electrons PE are also demagnified in the optical demagnification effected by the objective lens OB.

In the low-voltage scanning microscope of FIG. 4, the electrons PE are decelerated between the condenser lens K1 and the condenser lens K2. The retarding electrode R is disposed in that beam crossover point C1 that is produced by the condenser lens K1. For this illustrative embodiment of FIG. 4, however, the inhibiting action on the influence of the Boersch effect is lower than in the preceding illustrative embodiments.

When a scanning electron microscope comprises more than two condenser lenses, then retarding electrodes R, analogous to the illustrative embodiments of FIGS. 1-4, can also be provided therein between two respectively successive condenser lenses or within a condenser lens or in an objective lens or following an objective lens. A retarding electrode R can also be employed for the case of a scanning electron microscope having a field emission cathode. A deceleration of the primary electrons PE preceding the objective lens OB is most suitable in this case.

FIG. 5 shows a low-voltage scanning microscope comprising a condenser lens K1, a condenser lens K2, and a retarding electrode R at the crossover C2 produced by condenser lens K2, and further comprising an Einzel-lens E as immersion lens instead of the objective lens OB as provided in the embodiments of FIGS. 1-4. For a microscope with the Einzel-lens E serving as part of the retardation means, the electrode (E3, FIGS. 5 and 6) placed closest to the specimen PR has a potential U3 that is lower than the potential U1 of the first electrode (E1, FIGS. 5 and 6) of the Einzel-lens E, having reference to the beam direction (B, FIG. 6). Advantageously, this Einzel-lens E can also be fashioned such that it can be additionally utilized as a particle beam blanking system as disclosed by U.S. Pat. No. 4,439,685.

FIG. 6 shows various embodiments of devices for decelerating the primary electrons PE. In the respective embodiments, the beam axis is indicated at B-1 through B-4. Any and all electrostatic arrangements with two or more electrodes or combinations thereof can be employed for decelerating the primary electrons PE. For example, a two-electrode arrangement 1 comprised of two series-disposed mesh (net-like) electrodes N can be employed, wherein the mesh or network N2 lying closer to the specimen PR has a lower potential U2 than the mesh N1 lying remote from the specimen PR to define a beam decelerating field. Further, a two-electrode arrangement 2 can be employed wherein two apertured diaphragms B are disposed following one another with respective potentials U1 and U2 defining a beam decelerating field. This arrangement 2 has lens-like-properties.

Further, a two-electrode arrangement 3 can be employed which is formed of two tubes R01 and R02 disposed following one another. The potential U2 of the tube R02 nearer to the specimen PR in this embodiment is lower than the potential U1 of that tube R01 that is disposed farther from the specimen PR to define the beam decelerating field.

Further, an Einzel-lens can be employed for retarding the primary electrons PE. In order to achieve a retarding effect, the potential of the electrode E3 closest to the specimen PR is lower than the potential U1 of the electrode E1 placed farthest from the specimen PR. For blanking the primary electrons PE, the center electrode E2 of the Einzel-lens E receives a potential U2 which is strongly negative in comparison to the potential U1. (In the Einzel-lens known from U.S. Pat. No. 4,439,685, the potentials of the two outer electrodes are of the same magnitude so that no decelerating effect on the primary electrons PE impinging on the target is achieved.)

It will be apparent that many modifications and variations may be made without department from the scope of the teachings and concepts of the present invention.

In FIG. 5, in a first mode of operation, the retardation means R may be in the form of a single mesh electrode having negligible lens effect and having a potential relative to end wall 10 of the tube T such as to produce a substantial decelerating field on the particle beam in the vicinity of crossover C2, for example to effect a fifty percent reduction in the energy level of the beam. In such first mode of operation, the lens E may be operated as shown in FIG. 6 to effect a further substantial reduction in energy level e.g. a further fifty percent reduction, so that the beam impinges on the specimen PR with a desired final energy level e.g. corresponding to twenty-five percent of the energy level of the beam prior to retardation stage R. For the case where measurement means including detector DT is to be utilized for effecting electric potential measurements or spacial measurements on the specimen PR, the final energy level of the beam as it impinges on the specimen PR is preferably such that a charge balance of impinging and departing charge results at the specimen PR. For the case of a printing mode of operation, printing means including the deflection means D may form desired patterns on the specimen PR. Corresponding measurement means and printing means may be applied to each of the embodiments described herein including those of FIGS. 1–4, and the two stage retardation means may be employed in each such embodiment e.g. by substituting lens E of FIGS. 5 and 6 for the lenses OB of FIGS. 1–4.

Each of the embodiments of FIG. 6 is specifically applied to each of the other embodiments herein, by substituting any of the electrode systems 1, 2, 3 or E for the retarding means shown at R in FIGS. 1, 2, 3, 4 and 5, for example.

In a second mode of operation in FIG. 5, the retardation means at R may be removed, and the lens at E operated as taught in reference to FIG. 6 to effect a substantial reduction in the energy level of the beam, e.g. at least a fifty percent reduction so that the incident beam energy level impinging on specimen PR is suitable for measurement or pattern forming operations as previously described.

We claim as our invention:

1. A scanning particle microscope comprising:
   a particle optics unit including means for generating a particle beam at a first energy, a lens system for generating at least one beam crossover, a particle deflection system and an objective lens for focussing the particles in said beam onto a specimen to be examined; and
   means disposed within said particle optics unit for decelerating the particles in said beam from said first energy to a second energy which is lower than said first energy by at least a factor of two.

2. A scanning particle microscope as claimed in claim 1, wherein said lens system consists of at least one magnetic lens.

3. A scanning particle microscope as claimed in claim 1, wherein said lens system consists of at last two magnetic lenses, and wherein said means for decelerating the particles is disposed between said two magnetic lenses.

4. A scanning particle microscope as claimed in claim 1, wherein said lens system includes at least one magnetic lens, and wherein said means for decelerating the particles is disposed between said magnetic lens and said objective lens.

5. A scanning particle microscope as claimed in claim 1, wherein said means for decelerating said particles is disposed at said beam crossover.

6. A scanning particle microscope as claimed in claim 1, wherein said lens system includes at least one magnetic lens, and wherein said means for decelerating said particles is disposed within said magnetic lens.

7. A scanning particle microscope as claimed in claim 1, wherein said means for decelerating said particles is disposed within said objective lens.

8. A scanning particle microscope as claimed in claim 1, wherein said particle optics unit further includes a beam blanking system disposed at said beam crossover.

9. A scanning particle microscope as claimed in claim 1, wherein said means for decelerating the particles is disposed at said beam crossover, and wherein said particle optics unit further includes a beam blanking system disposed in the particle beam path behind said beam crossover.

10. A scanning particle microscope as claimed in claim 1, wherein said means for generating said particle beam includes an anode at an anode potential, and wherein said particle optics unit further includes a cylinder at said anode potential disposed between said means for generating said particle beam and said means for decelerating the particles.

11. A scanning article microscope as claimed in claim 10, wherein said cylinder consists of non-ferromagnetic material.

12. A scanning particle microscope as claimed in claim 1, wherein said means for generating said particle beam includes a field emission cathode, and wherein said means for decelerating the particles is disposed in the particle beam path in front of said objective lens.

13. A scanning particle microscope as claimed in claim 1, wherein said means for decelerating the particles is an electrostatic delay element.

14. A scanning particle microscope as claimed in claim 1, wherein said means for decelerating the particles is two spaced electrodes disposed for decelerating the particles of the beam at a distal portion of the beam path.

15. A scanning particle microscope as claimed in claim 1, wherein said means for decelerating the particles is a multi-electrode arrangement disposed for decelerating the particles of the beam at a distal portion of the beam path.

16. A scanning particle microscope as claimed in claim 1, wherein said means for decelerating the particles is a net-like electrode disposed for decelerating the particles of the beam at a distal portion of the beam path.

17. A scanning particle microscope as claimed in claim 1, wherein said means for decelerating the particles is a disphragm with a beam-receiving aperture disposed in the beam path at a distal portion thereof for decelerating the particles of the beam in said distal portion of the beam path.

18. A scanning particle microscope as claimed in claim 1, wherein the means for decelerating the particles is a tube lens surrounding the beam path at a distal portion thereof for decelerating the particles of the beam at said distal portion of the beam path.

19. A scanning particle microscope as claimed in claim 1, wherein the means for decelerating the particles is an Einsel lens disposed for decelerating the particles of the beam at a distal portion of the beam path.

20. A scanning particle microscope as claimed in claim 1, further comprising measurement means coupled with said beam for measuring a region of said specimen based on interaction of said specimen with said beam.

21. A scanning particle microscope as claimed in claim 1, wherein said lens system includes a beam-converging lens disposed following said means for generating said particle beam for converging said beam toward a crossover, and wherein said means for retarding the particles is disposed in the region of said crossover.

22. A scanning particle microscope as claimed in claim 1, further comprising printing means coupled with said particle beam for forming patterns on a region of said specimen by interaction of said particle beam with said specimen.

23. A scanning particle microscope comprising:
a particle optics unit including means for generating a particle beam at a first energy, a lens system for generating at least one beam crossover, a particle deflection system and an objective lens for focussing the particles in said beam onto a specimen to be examined;
a beam-guiding tube disposed such that said particles in said beam traverse said tube with said first energy; and
means disposed within said particle optics unit for decelerating the particles in said beam from said first energy to a second energy which is lower than said first energy by at least a factor of two.

* * * * *